United States Patent
Shuey

(10) Patent No.: US 7,772,829 B2
(45) Date of Patent: Aug. 10, 2010

(54) POWER METER AND METHOD FOR MEASURING POWER CONSUMPTION

(75) Inventor: Kenneth C. Shuey, Zebulon, NC (US)

(73) Assignee: Elster Electricity, LLC, Raleigh, NC (US)

( * ) Notice: Subject to any disclaimer, the term of this patent is extended or adjusted under 35 U.S.C. 154(b) by 185 days.

(21) Appl. No.: 12/148,578

(22) Filed: Apr. 21, 2008

(65) Prior Publication Data

US 2009/0261805 A1     Oct. 22, 2009

(51) Int. Cl.
*G01R 22/06*     (2006.01)
(52) U.S. Cl. ........................... 324/142; 324/110
(58) Field of Classification Search .................. None
See application file for complete search history.

(56) References Cited

U.S. PATENT DOCUMENTS

| | | |
|---|---|---|
| 4,190,800 A | 2/1980 | Kelly, Jr. et al. |
| 4,301,444 A | 11/1981 | Bruckert et al. |
| 4,331,915 A | 5/1982 | Fielden |
| 4,357,601 A | 11/1982 | McWilliams |
| 4,424,030 A | 1/1984 | Bateman et al. |
| 4,532,471 A | 7/1985 | Harley et al. |
| 4,540,984 A | 9/1985 | Waldman |
| 4,565,995 A | 1/1986 | Stokes |
| 4,571,691 A | 2/1986 | Kennon |
| 4,583,043 A | 4/1986 | Phillips |
| 4,656,593 A | 4/1987 | Gleba et al. |
| 4,680,706 A | 7/1987 | Bray |
| 4,707,679 A | 11/1987 | Kennon et al. |
| 4,727,315 A * | 2/1988 | Jones .......................... 324/110 |

(Continued)

FOREIGN PATENT DOCUMENTS

EP     0085769     8/1983

(Continued)

OTHER PUBLICATIONS

International Search Report/Written Opinion for PCT/US2008/002153, mailed Sep. 3, 2009.

(Continued)

*Primary Examiner*—Vinh P Nguyen
(74) *Attorney, Agent, or Firm*—Woodcock Washburn LLP

(57) ABSTRACT

A power meter for measuring power consumption and detecting the presence of an unsafe line condition is disclosed. The power meter has a service disconnect switch, which is interposed between load contacts and source contacts, the disconnect switch interrupts the flow of power from the source contacts to the load contacts when the disconnect switch is in an open position. The power meter also has a processor coupled to a two input signal processing circuit. The two input signal processing circuit receives a first and second voltage signal from the load contacts. The two input signal processing circuit converts the first and second voltage signal into a first and second voltage value. The processor computes the power consumption using the first and second voltage values in combination with current values. The processor uses the first or second voltage values to determine the presence of an unsafe line condition when either the first or second voltage value exceeds a first voltage threshold or the first or second voltage value is below a second voltage threshold when the service disconnect switch is in the open position.

21 Claims, 6 Drawing Sheets

U.S. PATENT DOCUMENTS

| | | | |
|---|---|---|---|
| 4,764,952 | A | 8/1988 | Feliu |
| 4,850,010 | A | 7/1989 | Stanbury et al. |
| 4,977,515 | A | 12/1990 | Rudden et al. |
| 4,980,836 | A | 12/1990 | Carter et al. |
| 4,999,730 | A | 3/1991 | Pickard |
| 5,086,292 | A | 2/1992 | Johnson et al. |
| 5,293,115 | A | 3/1994 | Swanson |
| 5,345,225 | A | 9/1994 | Davis |
| 5,422,565 | A | 6/1995 | Swanson |
| 5,473,322 | A | 12/1995 | Carney |
| 5,488,565 | A | 1/1996 | Kennon et al. |
| 5,523,559 | A | 6/1996 | Swanson |
| 5,553,084 | A | 9/1996 | Ackley et al. |
| 5,903,064 | A * | 5/1999 | Norberg ................ 307/40 |
| 5,940,009 | A * | 8/1999 | Loy et al. .......... 340/870.02 |
| 6,429,643 | B1 * | 8/2002 | Smith .................. 324/142 |
| 7,091,878 | B2 | 8/2006 | Holle et al. |
| 2004/0150384 | A1 | 8/2004 | Holle et al. |
| 2007/0247789 | A1 | 10/2007 | Benson et al. |

FOREIGN PATENT DOCUMENTS

| | | |
|---|---|---|
| GB | 2225867 | 6/1990 |
| GB | 2260415 | 4/1993 |

OTHER PUBLICATIONS

International Search Report for PCT/US2008/002153, mailed Jul. 8, 2008.

Notice of Allowance dated Dec. 15, 2009 for U.S. Appl. No. 12/080,210.

Office Action dated Sep. 30, 2009 for U.S. Appl. No. 11/710,837.

Response filed Dec. 30, 2009 in U.S. Appl. No. 11/710,837.

* cited by examiner

POWER METER AND METHOD FOR MEASURING POWER CONSUMPTION

FIELD OF INVENTION

The present invention relates generally to power systems, and more particularly to a system and a method for measuring and monitoring power in a utility meter by monitoring load side conditions.

RELEVANT BACKGROUND

Utility companies use power meters to regulate and monitor power usage. Early power meters were electromechanical in nature converting the flow of electricity through the power meter into mechanical movement. The mechanical movement was used to turn a recording device which recorded the amount of energy being used. As technology improved over the years, the design of the power meter incorporated new innovations such as increased processing capability within the meter, elimination of mechanical parts, better accuracy and the like.

The utility company has the ability to connect or disconnect the consumer from the electrical grid by opening or closing a service disconnect switch located at the power meter. In older power meters, the disconnect switch was located outside the metering device and was operated manually by a utility service technician. If the consumer failed to pay the utility company for his power usage, the utility company could discontinue power service by opening the service disconnect switch. Alternatively, if service work was being performed on the meter or consumer location, the utility company may elect to disconnect the consumer from the electrical service grid by opening the service disconnect switch.

As the power meter has evolved, the service disconnect switch was incorporated into the power meter design. By integrating the service disconnect switch into the power meter, the utility company was able to take advantage of the some of the new advancements of the power meter itself such as remote operation and communication. Remotely operating the service disconnect switch removes the need for manual intervention when disconnecting power to the consumer. Once the disconnect switch is opened, the flow of power to the consumer is interrupted.

Typically, the utility meter contains signal processing circuitry that monitors the source side of the utility meter when determining power usage. In some utility meters this may involve a signal processing circuit receiving more than two inputs which may sample inputs from several different source side and load side contacts. In addition, the monitoring circuitry also monitors the load side contacts for possible tampering conditions. If the service disconnect switch is open, and the signal processing circuitry detects the presence of an alternate voltage source on the load side of the utility meter, processing circuitry within the meter may determine that there is a possible tampering condition at the power meter. Should the service disconnect switch be closed without removing the alternate voltage source, a dangerous line condition may exist. Before closing the service disconnect switch, the utility company may notify the customer that an alternate voltage source has been detected and that before power can be restored, the alternative power source must be removed.

SUMMARY

Commonly, power meters were designed with signal processing circuitry with more than two inputs. The previous signal processing circuitry measures power consumption by measuring the voltages present on the load side of the service disconnect switch as well as detecting tamper conditions by monitoring both the load side and source side of the service disconnect switch. However there exists a need in the industry to measure power more efficiently by monitoring the power utilization and tamper conditions by using a two input signal processing circuit. Monitoring the load side voltage conditions with the two input signal processing circuit may reduce the size and quantity of the sampling circuitry necessary to measure the voltage and determine the amount of power flowing through the power meter. Additionally, in certain embodiments, the two input signal processing circuit may be used to monitor for unsafe or abnormal line conditions by also monitoring the source side line or load side conditions. The present disclosure addresses this need and discloses such a power meter.

A power meter for measuring power consumption and detecting the presence of an unsafe line condition is disclosed. The power meter has a service disconnect switch, which is interposed between load contacts and source contacts, the disconnect switch interrupts the flow of power from the source contacts to the load contacts when the disconnect switch is in an open position. The power meter also has a processor coupled to a two input signal processing circuit. The two input signal processing circuit receives a first and second voltage signal from the load contacts. The two input signal processing circuit converts the first and second voltage signal into a first and second voltage value. The processor computes the power consumption using the first and second voltage values in combination with current values. The processor uses the first or second voltage values to determine the presence of an unsafe line condition when either the first or second voltage value exceeds a first voltage threshold or the first or second voltage value is below a second voltage threshold when the service disconnect switch is in the open position.

A method for calculating an amount of power flowing through a power meter and detecting the presence of an unsafe condition is disclosed. The method provides the power meter, the power meter has a service disconnect switch. The service disconnect switch allows power to flow from source contacts to load contacts when the service disconnect switch is in a closed position and does not allow power to flow from source contacts to load contacts when the service disconnect switch is in an open position. The power meter further has a two input signal processing circuit. The two input signal processing circuit receives a first and a second voltage signal from the load contacts. The method further converts the first and second voltage signal by the two input signal processing circuit into a first and second voltage value. The method sends the first and second voltage values to a processor and the processor calculates the amount of power flowing through the power meter using the first and second voltage values. The method further determines if the first voltage value or the second voltage value is greater than a first voltage threshold or less than a second voltage threshold when the service disconnect switch is in the open position and indicates that an unsafe condition exists if either the first voltage value or the second voltage value is greater than the first voltage threshold or is less than the second voltage threshold.

A power meter for measuring power consumption and detecting the presence of an unsafe line condition is also disclosed. The power meter has a service disconnect switch. The service disconnect switch is interposed between load contacts and source contacts and interrupts the flow of electricity from the source contacts to the load contacts when the disconnect switch is in an open position. The power meter also has a processor coupled to a two input signal processing circuit. The two input signal processing circuit receives a first and second voltage signal from the load contacts. The two input signal processing circuit converts the first and second voltage signal into a first and second voltage value. The processor computes power consumption using the first and second voltage value in combination with a first and second current value. The first and second voltage value is also used by the processor to determine the presence of an unsafe line condition when the first or second voltage value exceeds a first voltage threshold when the service disconnect switch is in the open position.

A power meter for measuring power consumption and detecting the presence of an abnormal line condition is disclosed. The power meter has a service disconnect switch, the service disconnect switch is positioned between a load contact and a source contact, the disconnect switch interrupts the flow of power from the source contact to the load contact when the disconnect switch is in an open position. The power meter also has a processor coupled to a two input signal processing circuit. The two input signal processing circuit receives a load voltage signal from the load contact and a source voltage signal from the source contact. The two input signal processing circuit converts the load and source voltage signals into a load and source voltage values. The processor computes power consumption using the load voltage values in combination with a current value. The processor further uses the source voltage value to determine the presence of an abnormal line condition when the load voltage value differs from the source voltage value.

A more complete understanding of the present invention, as well as further features and advantages of the invention, will be apparent from the following detailed description and the accompanying drawings.

DETAILED DESCRIPTION

The detailed description set forth below in connection with the appended drawings is intended as a description of various embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention. For ease of illustration, all alternating current (AC) voltage values are represented in terms of root mean squared (RMS) values unless otherwise specified.

Figure 1:
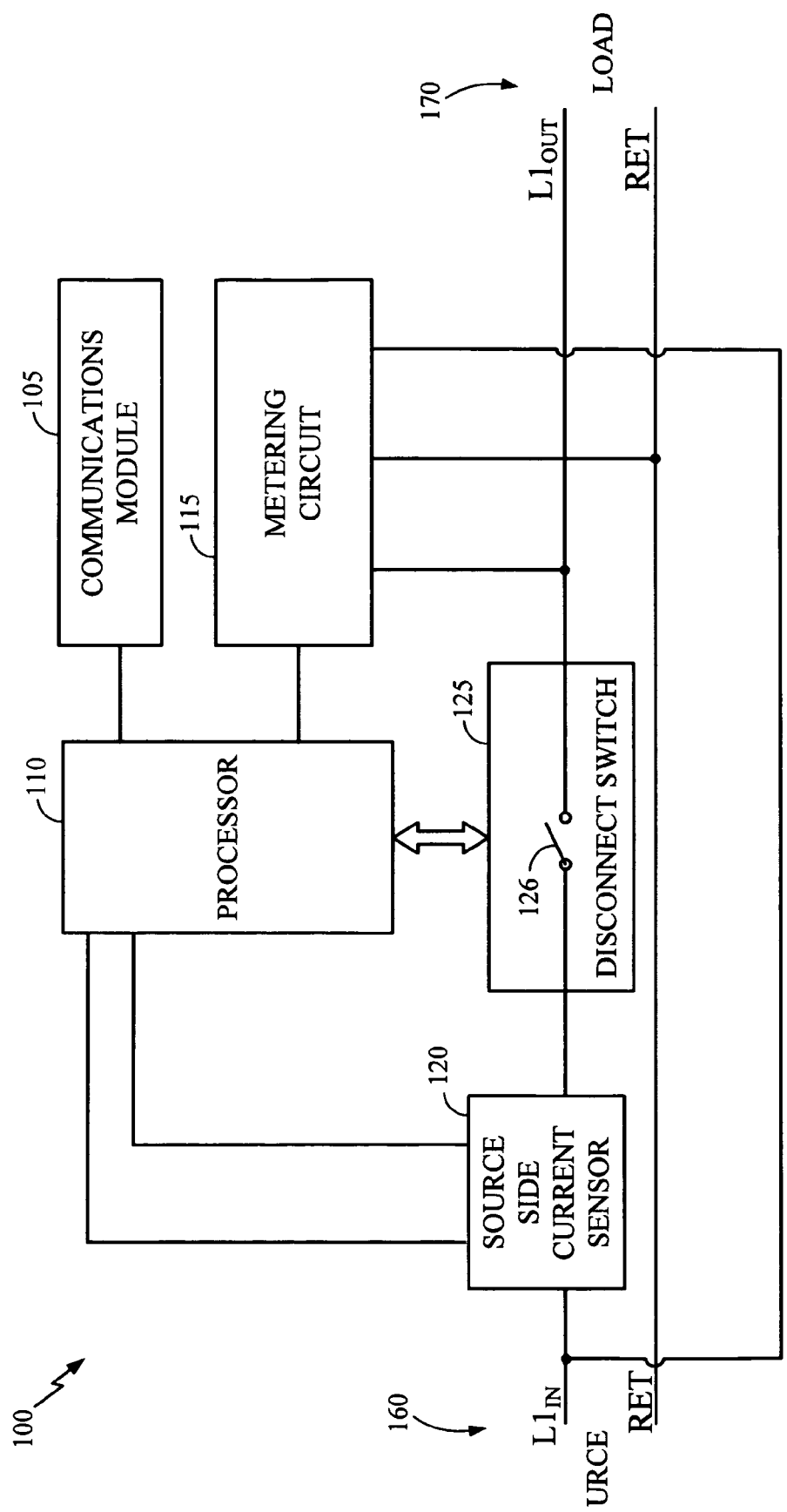
FIG. 1 shows a high level logic hardware block diagram of a 1S single phase single element power meter in accordance with one embodiment of the present invention.

FIG. 1 displays a high level view of a single phase single element power meter 100 utilizing one embodiment of the present invention. The power meter 100 is designed to receive a source voltage at source side contacts $L1_{IN}$ and RET at the source side 160 of the power meter 100. The source voltage may be provided from the utility power grid, typically from a transformer near the consumer site. The source voltage received at the source side 160 of the power meter 100 typically ranges between 0 and 120 VAC. The power meter 100 routes the electrical power through a source side current sensor 120. Coupled to the current sensor 120 is a service disconnect switch 125. Within the service disconnect switch 125 is a movable contact 126. Power is supplied to the consumer when the service disconnect switch 125 is closed (the movable contact 126 is engaged) via the load side 170 contacts $L1_{OUT}$ and RET. When the service disconnect switch 125 is open (the movable contact 126 is not engaged) power ceases to flow through the meter 100. As is discussed in greater detail in subsequent sections, the power meter 100 determines power usage by monitoring the voltage on the load side contact ($L1_{OUT}$) in combination with the current flowing through the power meter 100. Similarly, load side voltage conditions for the switch are determined by monitoring the load side contact with respect to the RET signal. In this typical embodiment the source side voltage at $L1_{IN}$ will provide power to the metering circuits and may be used by the meter to detect source side conditions like normal voltage and abnormal voltage such as power failure.

In an exemplary embodiment a processor 110 such as a Renesas H8/300 microprocessor monitors the current sensor 120 as well as other components within the power meter 100. The current sensor 120 may be a current transformer, shunt or the like which measures the amount of current flowing through the power meter 100. In one embodiment, the current sensor 120 may contain an internal analog to digital (A/D) converter which converts the amount of current flowing into a digital representation that the processor 110 may use to compute power consumption. Alternatively, a processor with an internal A/D converter may be used. In this embodiment, the current sensor 120 may send an analog signal corresponding to the amount of current flowing through the current sensor 120 and the microprocessor 110 determines the amount of current flowing by performing its own A/D conversion.

Also coupled to the processor 110 is a metering circuit 115. The metering circuit 115 is coupled directly to the load side contacts $L1_{OUT}$ and RET and the input contact $L1_{IN}$. The metering circuit 115 contains signal processing circuitry 240 which monitors the voltage levels present at the load side 170 of the service disconnect switch 125. In one embodiment of the present invention, the metering circuit 115 converts the voltage levels received at the load side contact $L1_{OUT}$ and the source side $L1_{IN}$ into corresponding digital representations which are presented to the processor 110. In an alternative embodiment, the metering circuit 115 may step the source side voltage and load side voltage down to a level that may be converted utilizing an internal signal processing circuit such as an A/D converter within the processor 110.

The power meter 100 has a communications module 105 which allows the utility company to communicate with the power meter 100. In one exemplary embodiment, the communications module 105 may utilize cellular telephone technology to communicate with the utility company service center or craftsperson. In this embodiment, the craftsperson may use portable computer with a cellular telephone to connect with the meter to retrieve status or other useful information from the meter. The craftsperson may also be able to instruct the processor 110 to open and close the service disconnect switch 125 remotely. In an alternative embodiment, the communications module 105 may support other types of wireless communications. In yet another alternative embodiment, the power meter 100 may be connected to a cable modem which in turn may be attached to the consumer's cable line. In this example, the utility company may connect to the power meter 100 by using TCP/IP or other networking protocols.

As mentioned previously, the utility company may monitor the conditions at the power meter 100 to detect any abnormal line conditions. For example, should a consumer not pay his/her utility bill, the utility company may decide to open the service disconnect switch 125 in the power meter 100 and disconnect the consumer from the power grid. Alternatively, the utility company may install a new power meter 100 at a new home or apartment and open the service disconnect switch 125 to keep the power meter 100 from delivering power to the new consumer until an account is set up. In either of these cases, the utility company may continue to monitor the conditions at the power meter 100 to ensure that before the service disconnect switch 125 is closed, there are no hazardous conditions on the consumer's power lines.

In one illustrative example, a consumer may attempt to bypass the power meter 100 by connecting the load side 170 to the source side 160. More specifically, the consumer may connect $L1_{IN}$ to $L1_{OUT}$. Accordingly, it would be advantageous for the utility company to detect this type of tampering.

Figure 2:
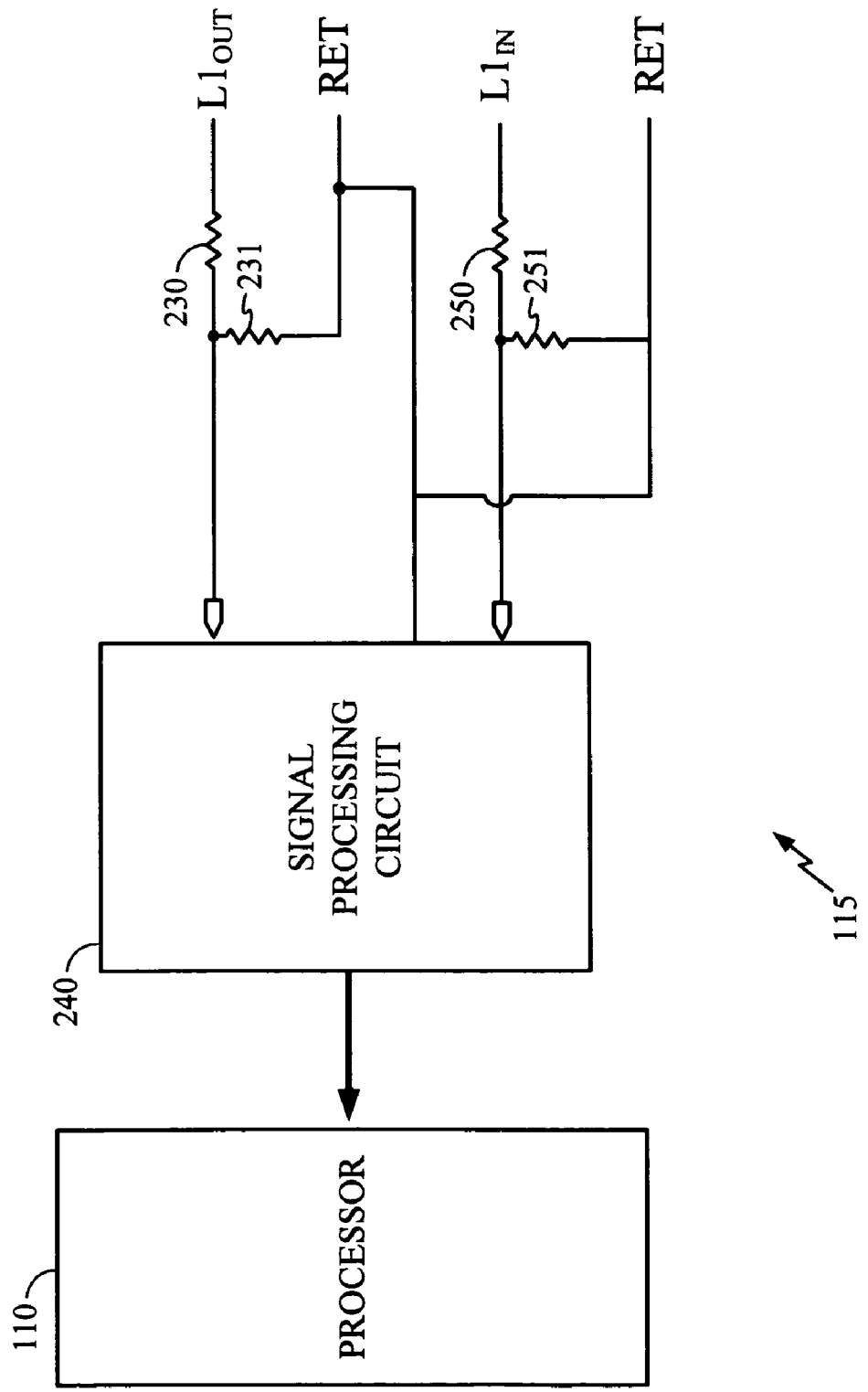
FIG. 2 displays a metering circuit in accordance to one embodiment of the present invention used by the power meter of FIG. 1.

FIG. 2 displays an exemplary metering circuit 115 in accordance with one aspect of the present invention. The load side voltage sensor 115 receives the voltage signal present at the load side contact $L1_{OUT}$ and measures it with respect to the RET signal. A two input signal processing circuit 240 is used to measure the voltage level present at the load side contact. In the embodiment as shown in FIG. 2, the two input signal processing circuit 240 may be a Digital Signal Processor (DSP). Utilizing the inventive concepts of the present invention, two inputs into the two input signal processing circuit 240 are used to facilitate the measuring of power consumption as well as monitoring for an unsafe line conditions (i.e. possible tampering) and abnormal input conditions.

When the service disconnect switch 125 is closed, power is flowing through the power meter 100. When taking power measurements, the voltage signal present at the load side contact $L1_{OUT}$ is measured. This measurement is performed with respect to RET by utilizing the voltage divider created by the resistors 230 and 231. In an exemplary embodiment, resistor 231 may be a 1 KΩ½ watt resister and resistor 230 may be a 1 MΩ½ watt resister. In this embodiment, voltage at load side contact $L1_{OUT}$ is stepped down approximately 1000:1. Thus, during normal operation when the service disconnect switch 125 is closed, the AC waveform present at load side contact $L1_{OUT}$ is reduced to a maximum of about 0.12 VAC and presented to one input of the signal processing circuit 240. The two input signal processing circuit 240 samples this voltage and presents the converted voltage information to the processor 110. The processor 110 also receives the value relating to the amount of current flowing through the source side current sensor 120. Using these two pieces of information, the processor 110 determines and stores the amount of power the subscriber is using.

The metering circuit 115 also uses the first input to the two input signal processing circuit 240 to monitor the $L1_{OUT}$ contact for any indications of tampering when the disconnect switch is open. The measurement of voltage at the $L1_{OUT}$ contact is measured with respect to RET as described previously and the processor combines this voltage information with the closed/open status of the switch to determine if a tamper condition may exist on the load side of the meter.

The metering circuit 115 uses the second input to the two input signal processing circuit 240 to monitor the $L1_{IN}$ voltage by utilizing the voltage divider created by the resistors 250 and 251. In an exemplary embodiment, resistor 251 may be a 1 KΩ½ watt resister and resistor 250 may be a 1 MΩ½ watt resister. In this embodiment, voltage at source side contact $L1_{IN}$ is stepped down approximately 1000:1. When the service disconnect switch 125 is closed or open, the voltage measured at the $L1_{IN}$ contact with respect to RET will be monitored for normal or abnormal source voltage conditions. At the same time, the processor 110 continues to monitor the voltage at $L1_{OUT}$. If the processor 110 determines that the disconnect switch is open and there is about 120 VAC on the $L1_{IN}$ contact as well as less than 10 VAC on the $L1_{OUT}$ contact, the power meter 100 is considered to be operating normally.

As mentioned previously, the processor 110 monitors the status of the service disconnect switch 125. If the service disconnect switch 125 is open, there should be no voltage present at the $L1_{OUT}$ contact as measured with respect to RET. If there is voltage present, the processor 110 may raise a tampering alarm and notify the utility company. Additionally, with the service disconnect switch 125 closed, a voltage more than 10 VAC may be measured at the $L1_{OUT}$ contact with respect to the $L1_{IN}$ contact. If there is a voltage difference more than 10 VAC measured between the $L1_{IN}$ and $L1_{OUT}$ contacts, the processor 110 may raise an alarm and notify the utility company that the switch is not operating properly.

Figure 3:
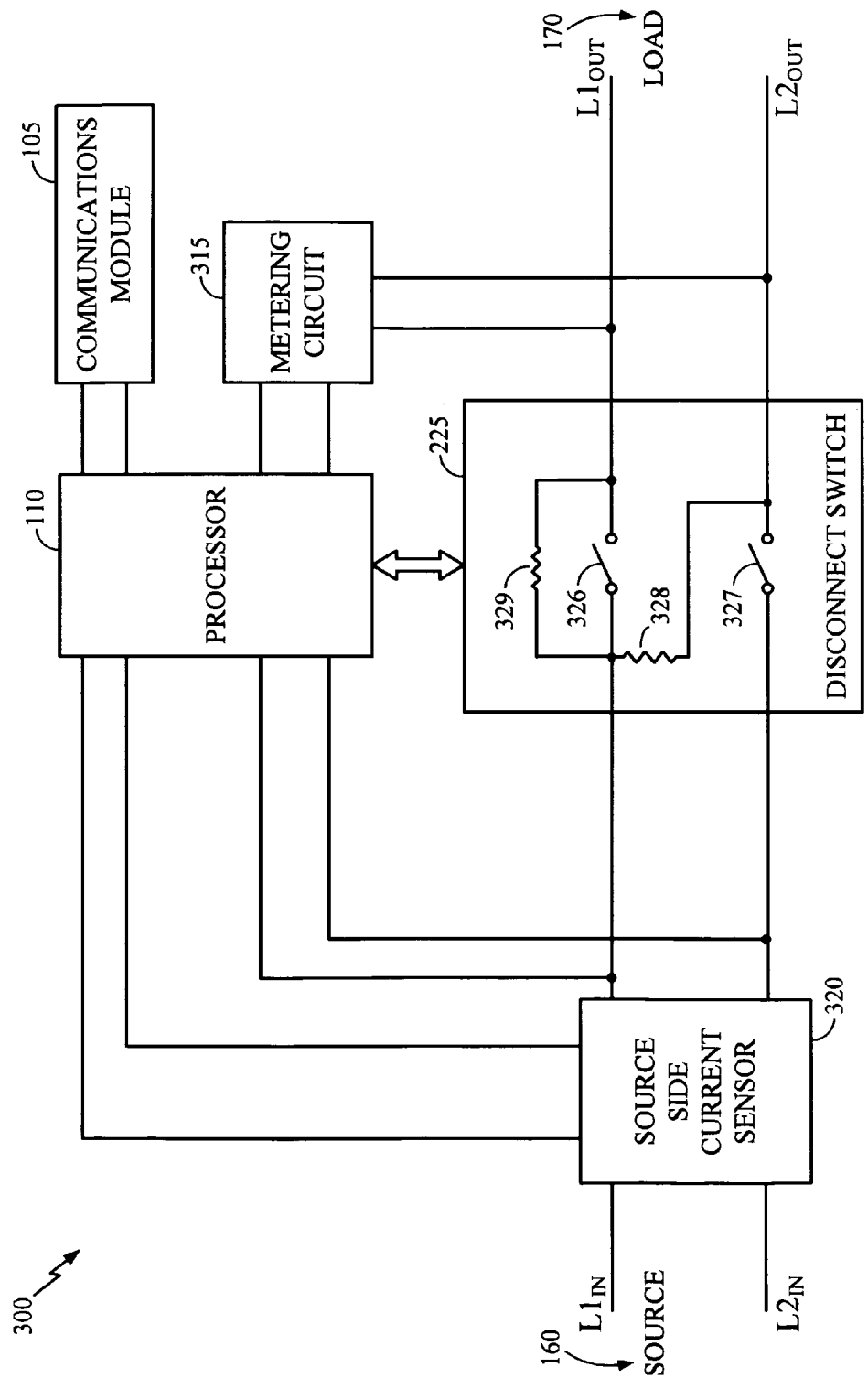
FIG. 3 displays a 2S single phase two element two wire power meter in accordance with another embodiment of the present invention.

FIG. 3 displays a power meter 300 similar to a 2S single phase two wire, two element watt-hour meter. Those skilled in the art will recognize that the power meter 300 can be installed to measure power in a conventional 120/240 split phase electric system and in this configuration there is no neutral connection brought into the power meter 300. The power meter device 300 is designed to receive a source voltage at $L1_{IN}$ and $L2_{IN}$ at the source side 160 of the power meter 300. The source voltage may be provided from the utility power grid, typically from a transformer near the subscriber site. The source voltage received at the source side 160 of the power meter 300 typically ranges between 0 and 240 VAC. Within the power meter 300 the electrical power is routed through a current sensor 320. The current sensor 320 measures the amount of current flowing through each source side contact ($L1_{IN}$ and $L2_{IN}$) of the power meter 300. Coupled to the current sensor 320 is a service disconnect switch 325. Power is supplied to the load side 170 of the power meter 300 through the service disconnect switch 325 when the service disconnect switch 325 is closed. From the service disconnect switch 325, power is routed to the consumer via the load side contacts $L1_{out}$ and $L2_{out}$.

The processor 110 is coupled to the service disconnect switch 325 and may open or close the service disconnect switch 325 by opening and closing an electromechanical solenoid switch which moves the moveable contacts 326 and 327. Opening and closing the service disconnect switch 325 allows the processor 110 to connect or disconnect the consumer from the power grid. Power is supplied to the consumer when the service disconnect switch 325 is closed (the movable contacts 326 and 327 are engaged) via the load side 170 contacts $L1_{OUT}$ and $L2_{OUT}$.

Similar to the power meter 100 of FIG. 1, the processor 110 determines power usage by measuring the voltage present at the load side contacts $L1_{OUT}$ and $L2_{OUT}$ when the service disconnect switch 325 is closed and multiplying it by the collective current measured by the current sensor 320. When the service disconnect switch 325 is open, the processor 110 monitors the load side contacts $L1_{OUT}$ and $L2_{OUT}$ to determine if an unsafe line condition exists. As is explained in subsequent sections, bypass resistors 328 and 329 are used by the metering circuit 315 to monitor for unsafe line conditions.

In the power meter 300, the processor 110 monitors the current sensor 320 as well as other components within the power meter 300. The current sensor 320 may have an internal analog to digital (A/D) converter allowing the processor 110 to receive a digital representation of the amount of the current flowing through the current sensor 320. The current sensor 320 may be a current transformer, shunt or the like. Alternatively, a microprocessor 110 with an internal A/D converter may receive an analog signal from the current sensor 320. In this embodiment, the current sensor 320 may send an analog signal corresponding to the amount of current flowing through the current sensor 320 and the microprocessor 110 determines the amount of current flowing by performing its own A/D conversion. Because the voltage received at the source side 160 of the power meter 300 is of the same phase, a single current transformer may be used in the current sensor 320.

Also communicating with the processor 110 is a metering circuit 315. The metering circuit 315 is coupled directly to the load side contacts $L1_{OUT}$ and $L2_{OUT}$ and the source side contact $L2_{IN}$. Within the metering circuit 315 is a signal processing circuit which measures the voltage levels at the line side contacts $L1_{OUT}$ and $L2_{OUT}$ with respect to the source side contact $L2_{IN}$. Those skilled in the art will recognize that the Form 2S meter configuration does not include a connection to neutral or earth ground. Similar to the metering circuit 115 of FIG. 2, the metering circuit 315 monitors the voltage levels present at the load side 170 of the service disconnect switch 325. In one embodiment of the present invention, the metering circuit 315 converts the voltage levels received to a corresponding digital representation which is presented to an input of the processor 110. In an alternative embodiment, the metering circuit 115 may step the measured voltage down to a level that may be presented and converted utilizing an internal A/D converter within the processor 110.

Figure 4:
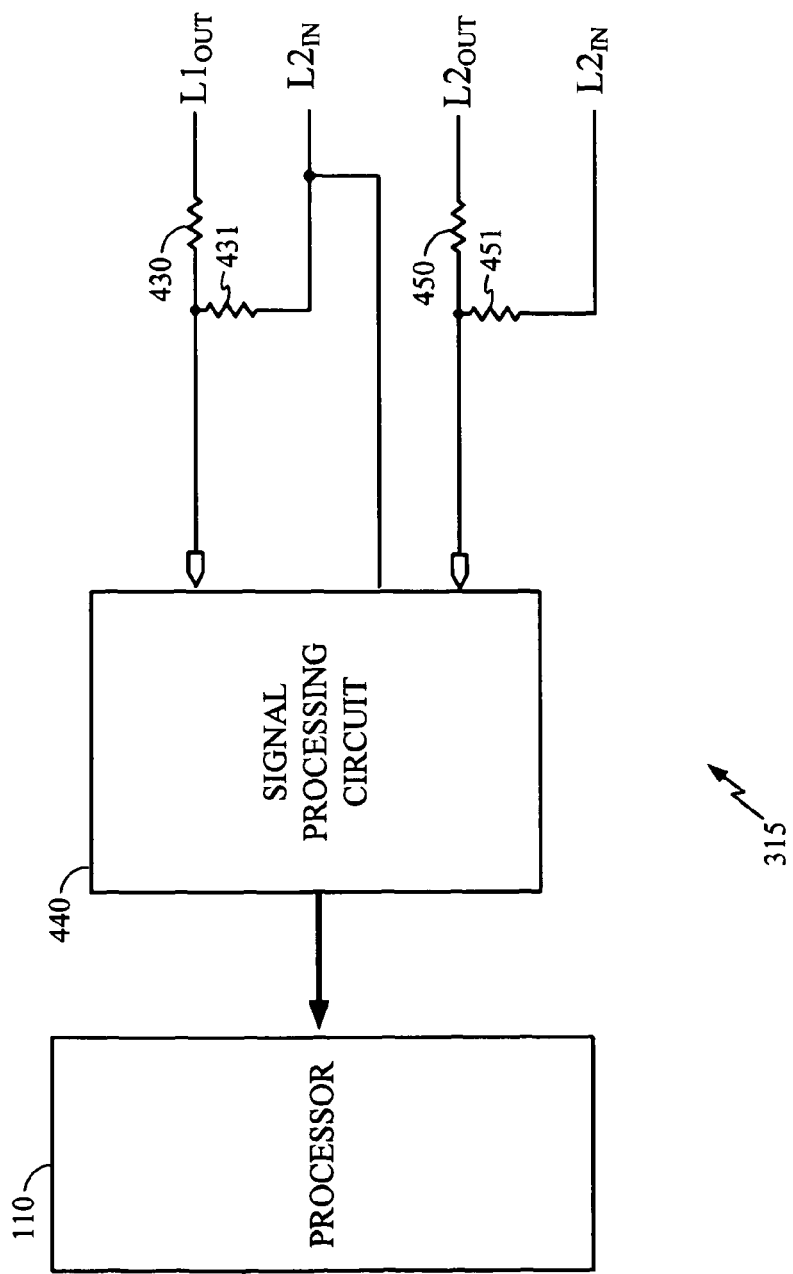
FIG. 4 displays a metering circuit in accordance to one embodiment of the present invention used by the power meter of FIG. 3.

FIG. 4 displays an exemplary metering circuit 315 in accordance with another aspect of the present invention. The metering circuit 315 receives the voltage signals present at the $L1_{OUT}$ and $L2_{OUT}$ contacts and measures them with respect to the $L2_{IN}$ contact. In this embodiment, a two input signal processing circuit 440 is used to measure the voltage levels present at the load side contacts. Those skilled in the art appreciate that the two input signal processing circuit 440 may be a digital signal processor (DSP) or the like which may be programmed to convert analog voltage signals into digital representations. Utilizing the inventive concepts of the present invention, two inputs into the two input signal processing circuit 440 are used in order to facilitate the measuring of power consumption as well as possible tampering.

When the service disconnect switch 325 is closed, current may be flowing through the power meter 300. When performing power measurements, the voltage signals present at the load side contacts $L1_{OUT}$ and $L2_{OUT}$ are measured. This measurement is performed with respect to $L2_{IN}$ by utilizing the voltage divider created by the resistors 430 and 431 as well as the voltage divider created by the resistors 450 and 451. In an exemplary embodiment, resistors 431 and 451 may be a 1KΩ½ watt resister and resistors 430 and 450 may be a 1MΩ½ watt resister. In this embodiment, the voltages at load side contact $L1_{OUT}$ and $L2_{OUT}$ are stepped down approximately 1000:1.

During normal operation when the service disconnect switch 325 is closed, the AC voltage waveforms present at load side contact $L1_{OUT}$ is reduced to a maximum of about 0.24 VAC and presented to the one of the two inputs of the signal processing circuit 440. Typically, when the voltage at the load side contact $L1_{OUT}$ is greater than about 170 VAC, the conditions at the power meter 300 are within operating norms.

Additionally, when the service disconnect switch 325 is closed, the voltage measured at load side contact $L2_{OUT}$ with respect to $L2_{IN}$ should be approximately zero VAC. The two input signal processing circuit 440 samples these voltages and presents the voltage information to the processor 110. The processor 110 also receives the value relating to the sum of current flowing through the source side current sensor 120. Using the voltage difference measured between $L1_{OUT}$ and $L2_{OUT}$ and the sum of the current flowing through the power meter 300, the processor 110 determines and stores the amount of power the subscriber is using.

The inclusion of bypass resistors 328 and 329 (FIG. 3) allows the processor 110 to confirm that the service disconnect switch 325 is in the open position. In one embodiment, the bypass resistors 328 and 329 may be 1MΩ½ watt resistors. Alternatively, the bypass resistors 328 and 329 may be comprised of several resistors placed in series. Using multiple resistors may provide the metering circuit 315 surge protection. When the service disconnect switch 325 is open, the voltage present across the voltage divider comprised of bypass resistor 329 and resistors 430 and 431 is about 120 VAC. In other words, the voltage present at $L1_{IN}$ (which is about 240 VAC) is divided in half by the voltage divider which results in about 120 VAC present at $L1_{OUT}$ with respect to $L2_{IN}$. Similarly, the voltage divider created by the bypass resistor 328 and resistors 450 and 451 steps down the voltage present at $L2_{OUT}$ with respect to $L2_{IN}$ to about 120 VAC. Thus, when the service disconnect switch 225 is in the open position, the voltage at $L1_{OUT}$ and $L2_{OUT}$ with respect to $L2_{IN}$ is about 120 VAC. Utilizing the bypass resistors 328 and 329, and the metering circuit 315, the processor 110 may confirm the status of the service disconnect switch 225. Additionally, if the voltage is significantly different than about 120 VAC when the service disconnect switch 325 is open, the processor 110 may determine a tamper condition may exist at the power meter 300. Those skilled in the art will recognize that normal loading conditions on the meter will not affect the normal 120 VAC readings at $L1_{OUT}$ and $L2_{OUT}$.

Figure 5:
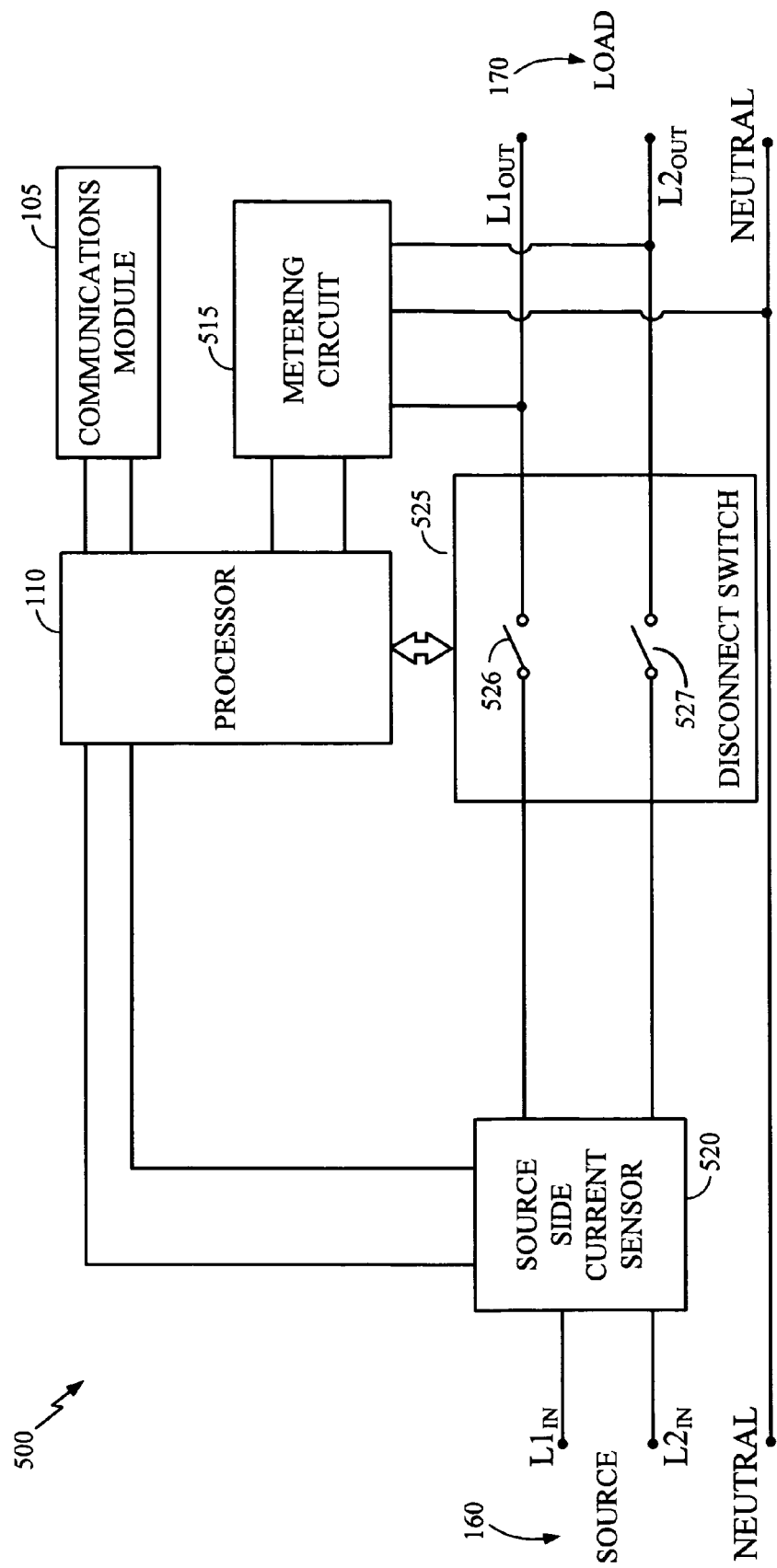
FIG. 5 displays a 12S two phase two element power meter in accordance with another embodiment of the present invention.

FIG. 5 displays a power meter 500 for use in applying a 120/208 type electric service commonly known to those skilled in the art as a Form 12S meter. The power meter 500 may also be referred to in the industry as an urban three wire, two phase, two element watt-hour meter. The power meter 500 is designed to receive a source voltage at $L1_{IN}$ and $L2_{IN}$ as well as a NEUTRAL connection at the source side 160 of the power meter 500. The source voltage may be provided from the utility power grid, typically from a transformer near the subscriber site. The source voltage received at the source side 160 of the power meter 300 typically ranges between 0 and 208 VAC. Those of sufficient skill in the art appreciate that the source voltage measured at $L1_{IN}$ with respect to NEUTRAL is about 120 VAC. Similarly, the voltage input measured at $L2_{IN}$ with respect to NEUTRAL is about 120 VAC, and the voltage as measured between $L1_{IN}$ with respect to $L2_{IN}$ is about 208 VAC.

Electrical power is routed through a current sensor 520 which measures the amount of current flowing through the input contacts $L1_{IN}$ and $L2_{IN}$. Since the power meter 500 is a dual phase meter, two current transformers or the like may be used to measure the amount of current flowing through each source side contact. Coupled to the current sensor 520 is a service disconnect switch 525. Power is supplied to the load side 170 of the power meter 500 through the service disconnect switch 525 when the service disconnect switch 525 is closed. From the service disconnect switch 525, power is routed to the consumer via the load side contacts $L1_{out}$ and $L2_{out}$.

The processor 110 may open or close the service disconnect switch 325 by opening and closing an electromechanical solenoid switch which move the moveable contacts 526 and 527. Opening and closing the service disconnect switch 525 allows the processor 110 to connect or disconnect the consumer from the power grid. Power is supplied to the consumer when the service disconnect switch 525 is closed via the load side 170 contacts $L1_{OUT}$ and $L2_{OUT}$. When the service disconnect switch 525 is open power ceases to flow through the power meter 500. The power meter 500 determines power usage by measuring the voltage present at both of the load side contacts (in this embodiment $L1_{OUT}$ and $L2_{OUT}$) and the current through both of the load side contacts. In addition, the power meter 500 determines load side voltage conditions when the service disconnect switch 525 is open by monitoring the same load side contacts.

In the power meter 500, the processor 110 monitors the current sensor 520 as well as other components within the power meter 500. The current sensor 520 may have an internal analog to digital (A/D) converter allowing the processor 110 to receive a digital representation of the amount of the current flowing through source side contact ($L1_{IN}$ and $L2_{IN}$). The current sensor 320 may have two current transformers, shunts or the like. Alternatively, a microprocessor 110 with an internal A/D converter may receive two analog signals from the current sensor 520. In this embodiment, the current sensor 520 may send the analog signals corresponding to the amount of current flowing through source side contacts ($L1_{IN}$ and $L2_{IN}$) and the microprocessor 110 determines the amount of current flowing by performing its own A/D conversion.

Also coupled to the processor 110 is a metering circuit 515. The metering circuit 515 is coupled directly to the load side contacts $L1_{OUT}$ and $L2_{OUT}$ and the NEUTRAL contact. Similar to the metering circuit 115 of FIG. 2, the metering circuit 515 monitors the voltage levels present at the load side 170 of the service disconnect switch 525. In one embodiment of the present invention, the metering circuit 515 converts the voltage levels received to a corresponding digital representation which is presented to an input of the processor 110. In an alternative embodiment, the metering circuit 515 may step the source side voltage down to a level that may be presented and converted utilizing an internal A/D converter within the processor 110.

Figure 6:
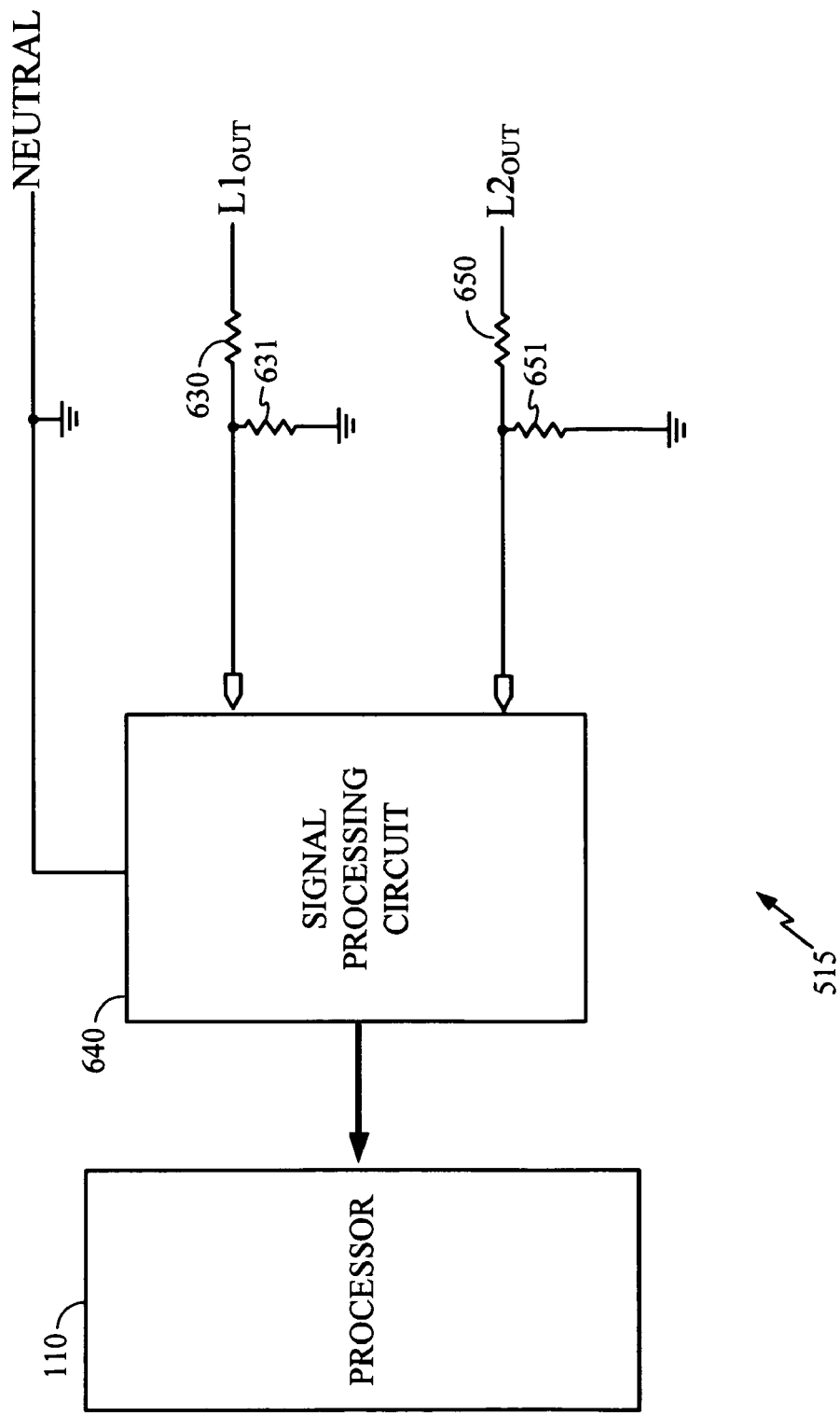
FIG. 6 displays a metering circuit in accordance to one embodiment of the present invention used by the power meter of FIG. 5.

FIG. 6 displays an exemplary metering circuit 515 in accordance with another aspect of the present invention. The metering circuit 515 receives the voltage signals present at the $L1_{OUT}$ and $L2_{OUT}$ contacts and measures them with respect to the NEUTRAL contact. In this embodiment, a two input signal processing circuit 640 is used to measure the voltage levels present at the load side contacts. Those skilled in the art appreciate that the two input signal processing circuit 640 may be a digital signal processor (DSP) or the like which may be programmed to convert analog voltage signals into digital representations. Utilizing the inventive concepts of the present invention, two inputs into the two input signal processing circuit 640 are used in order to facilitate the measuring of power consumption as well as possible tampering.

When the service disconnect switch 525 is closed, current may be flowing through the power meter 300. When performing power measurements, the voltage signals present at the load side contacts $L1_{OUT}$ and $L2_{OUT}$ are measured. This measurement is performed with respect to NEUTRAL by utilizing the voltage divider created by the resistors 630 and 631 as well as the voltage divider created by the resistors 650 and 651. In an exemplary embodiment, resistors 631 and 651 may be a 1KΩ½ watt resister and resistors 630 and 650 may be a 1MΩ½ watt resister. In this embodiment, the voltages at load side contact $L1_{OUT}$ and $L2_{OUT}$ are stepped down approximately 1000:1.

During normal operation when the service disconnect switch 525 is closed, the AC voltage waveforms present at load side contact $L1_{OUT}$ is reduced to a maximum of about 0.12 VAC and presented to the one of the two inputs of the signal processing circuit 640. Typically, when the voltage at the load side contact $L1_{OUT}$ is about 120 VAC, the conditions at the power meter 500 are within operating norms. Additionally, when the service disconnect switch 525 is closed, the voltage measured at load side contact $L2_{OUT}$ with respect to NEUTRAL should also be about 120 VAC. The two input signal processing circuit 640 samples these voltages and presents the voltage information to the processor 110. The processor 110 also receives the value relating to the amount of current flowing through the each source side contact ($L1_{IN}$ and $L2_{IN}$). The processor 110 uses the voltage measured at $L1_{OUT}$ and $L2_{OUT}$ as well as the measured current flowing through each source side contact ($L1_{IN}$ and $L2_{IN}$) to determine the amount of power used by the consumer.

When the service disconnect switch 525 is in the open position there should be no voltage present at the load side contacts $L1_{OUT}$ and $L2_{OUT}$, when measured with respect to NEUTRAL. If any voltage greater than about 50 VAC is detected when the service disconnect switch 525 is open and no current is flowing through the current sensor 520, the processor 110 may determine a tamper condition may exist at the power meter 500.

The various illustrative logical blocks, modules, circuits, elements, and/or components described in connection with the embodiments disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing components, e.g., a combination of a DSP and a microprocessor, a plurality of microprocessors, one or more microprocessors in conjunction with a DSP core, or any other such configuration.

Although specific embodiments have been illustrated and described herein, those of ordinary skill in the art appreciate that any arrangement, which is calculated to achieve the same purpose, may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A power meter for measuring power consumption and detecting the presence of an unsafe line condition comprising:
    a service disconnect switch, the service disconnect switch interposed between load contacts and source contacts, the disconnect switch interrupting a flow of power from the source contacts to the load contacts when the disconnect switch is in an open position;
    a processor coupled to;
        a two input signal processing circuit, the signal processing circuit receiving a first and second voltage signal from the load contacts, the two input signal processing circuit converting the first and second voltage signals into a first and second voltage values, the processor computing power consumption using the first and second voltage values in combination with current values, the processor further using the first or second voltage values to determine the presence of unsafe line conditions when either of the first or second voltage values exceed a first voltage threshold or are below a second voltage threshold when the service disconnect switch is in the open position.

2. The power meter of claim 1 wherein the processing circuit is a digital signal processor (DSP).

3. The power meter of claim 1 wherein the first voltage threshold is about 170VAC.

4. The power meter of claim 1 wherein the second voltage threshold is about 50VAC.

5. The power meter of claim 1 wherein the power meter is a two wire single phase single element power meter.

6. The power meter of claim 1 wherein the two input signal processing circuit is contained within the processor.

7. A method for calculating an amount of power flowing through a power meter and detecting the presence of an unsafe line condition, the method comprising:
    providing the power meter having a service disconnect switch, the service disconnect switch allowing power to flow from source contacts to load contacts when the service disconnect switch is in a closed position and not allowing power to flow from source contacts to load contacts when the service disconnect switch is in an open position, the power meter further having a two input signal processing circuit, the two input signal processing circuit receiving a first and a second voltage signal from the load contacts;
    converting the first and second voltage signal by the two input signal processing circuit into a first and second voltage value;
    sending the first and second voltage value to a processor;
    calculating the amount of power flowing through the power meter by using the first and second voltage values;
    determining if either of the first or second voltage values is greater than a first voltage threshold or if either the first or second voltage values is less than a second voltage threshold when the service disconnect switch is in the open position; and,
    indicating that the unsafe line condition exists if either of the first or second voltage values is greater than the first voltage threshold or if either of the first or second voltage values is less than the second voltage threshold.

8. The method of claim 7 wherein the processing circuit is a digital signal processor (DSP).

9. The method of claim 7 wherein the first voltage threshold is about 170VAC.

10. The method of claim 7 wherein the second voltage threshold is about 50VAC.

11. The method of claim 7 wherein the power meter is a two wire single phase single element power meter.

12. A power meter for measuring power consumption and detecting the presence of an unsafe line condition comprising:
    a service disconnect switch, the service disconnect switch interposed between load contacts and source contacts, the service disconnect switch interrupting a flow of electricity from the source contacts to the load contacts when the disconnect switch is in an open position;
    a processor coupled with
    a two input signal processing circuit receiving a first and second voltage signal from the load contacts, the two input signal processing circuit converting the first and second voltage signal into a first and second voltage value, the processor computing power consumption using the first and second voltage value in combination with first and second current values, the first and second voltage values further used by the processor to determine the presence of an unsafe line condition when the first or second voltage value exceeds a first voltage threshold when the service disconnect switch is in the open position.

13. The power meter of claim 12 wherein the power meter is a three wire, two phase, two element power meter.

14. The power meter of claim 12 wherein the first voltage threshold is about 70VAC.

15. The power meter of claim 12 wherein the two input signal processing circuit is contained within the processor.

16. The power meter of claim 12 wherein the two input signal processing circuit is a digital signal processor (DSP).

17. A power meter for measuring power consumption and detecting the presence of an abnormal line condition comprising:
    a service disconnect switch, the service disconnect switch interposed between a load contact and a source contact, the disconnect switch interrupting a flow of power from the source contact to the load contact when the disconnect switch is in an open position;
    a processor coupled to;
    a two input signal processing circuit, the two input signal processing circuit receiving a load voltage signal from the load contact and a source voltage signal from the source contact, the two input signal processing circuit converting the load and source voltage signals into a load and source voltage values, the processor computing power consumption using the load voltage values in combination with a current value, the processor further using the source voltage value to determine the presence of an abnormal line condition when the load voltage value differs from the source voltage value.

18. The power meter of claim 17 wherein the power meter is a two wire, single phase, single element power meter.

19. The power meter of claim 17 wherein the first voltage threshold is about 70VAC.

20. The power meter of claim 17 wherein the two input signal processing circuit is contained within the processor.

21. The power meter of claim 17 wherein the two input signal processing circuit is a digital signal processor (DSP).

* * * * *